United States Patent
Monoi

(10) Patent No.: US 10,910,429 B2
(45) Date of Patent: Feb. 2, 2021

(54) CMOS IMAGE SENSOR

(71) Applicant: HUAWEI TECHNOLOGIES CO., LTD., Guangdong (CN)

(72) Inventor: Makoto Monoi, Yokohama (JP)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/341,482

(22) PCT Filed: Oct. 14, 2016

(86) PCT No.: PCT/CN2016/102195
§ 371 (c)(1),
(2) Date: Apr. 12, 2019

(87) PCT Pub. No.: WO2018/068322
PCT Pub. Date: Apr. 19, 2018

(65) Prior Publication Data
US 2019/0305029 A1 Oct. 3, 2019

(51) Int. Cl.
*H01L 27/146* (2006.01)
*H04N 5/3745* (2011.01)
*H04N 5/374* (2011.01)

(52) U.S. Cl.
CPC .. *H01L 27/14641* (2013.01); *H01L 27/14605* (2013.01); *H01L 27/14643* (2013.01); *H04N 5/374* (2013.01); *H04N 5/3745* (2013.01)

(58) Field of Classification Search
CPC ......... H01L 27/14641; H01L 27/14605; H01L 27/14643; H04N 5/374; H04N 5/3745
(Continued)

(56) References Cited

U.S. PATENT DOCUMENTS 6,522,356 B1* 2/2003 Watanabe ............... H04N 5/374
 348/272
6,822,682 B1* 11/2004 Kawajiri ........... H01L 27/14812
 250/208.1
(Continued)

FOREIGN PATENT DOCUMENTS

CN 1662040 A 8/2005
CN 1734779 A 2/2006
(Continued)

OTHER PUBLICATIONS

Extended European Search Report issued in European Application No. 16918858.8 dated Jun. 3, 2019, 9 pages.
(Continued)

*Primary Examiner* — Sinh Tran
*Assistant Examiner* — Zhenzhen Wu
(74) *Attorney, Agent, or Firm* — Fish & Richardson P.C.

(57) ABSTRACT

Examples of complementary metal oxide semiconductor (CMOS) image sensor are provided. One example CMOS image sensor includes a first plurality of pixel units that are arranged in lattice manner and that are obtained by rotating a rectangular area including four sets of photodiodes and transfer gates (TX) and one charge accumulation portion by 45 degrees. The example CMOS image sensor further includes a second plurality of pixel units that are arranged by shifted in a horizon direction by half of the distance between the centers of the adjacent pixel units in the horizon direction and shifted in a vertical direction by half of the distance between the centers of the adjacent pixel units in the vertical direction from the positions of the respective pixel units of the first plurality of pixel units.

10 Claims, 10 Drawing Sheets

(58) Field of Classification Search
USPC .......................................................... 348/301
See application file for complete search history.

(56) References Cited

U.S. PATENT DOCUMENTS

| | | |
|---|---|---|
| 2003/0010981 A1 | 1/2003 | Sekine |
| 2005/0185073 A1 | 8/2005 | Watanabe |
| 2006/0038904 A1 | 2/2006 | Kudoh |
| 2006/0139469 A1* | 6/2006 | Yokota .................... H04N 5/347 348/272 |
| 2007/0146511 A1* | 6/2007 | Kinoshita .............. H04N 9/045 348/272 |
| 2010/0177226 A1 | 7/2010 | Itonaga et al. |
| 2010/0309351 A1 | 12/2010 | Smith et al. |
| 2011/0080493 A1 | 4/2011 | Kono et al. |
| 2011/0090382 A1* | 4/2011 | Glenn .................... H04N 9/045 348/280 |
| 2012/0147233 A1* | 6/2012 | Sakai ....................... H04N 9/09 348/294 |
| 2015/0373289 A1* | 12/2015 | Choi ...................... H04N 9/045 348/272 |
| 2017/0013211 A1 | 1/2017 | Kato et al. |
| 2018/0048836 A1* | 2/2018 | Sakano .............. H04N 5/35563 |

FOREIGN PATENT DOCUMENTS

| | | |
|---|---|---|
| CN | 1798274 A | 7/2006 |
| CN | 101452942 A | 6/2009 |
| CN | 101794800 A | 8/2010 |
| CN | 102036020 A | 4/2011 |
| CN | 104009049 A | 8/2014 |
| CN | 106030804 A | 10/2016 |
| JP | 2007189085 A | 7/2007 |

OTHER PUBLICATIONS

International Search Report and Written Opinion issued in International Application No. PCT/CN2016/102195 dated May 4, 2017, 13 pages.
Office Action issued in Chinese Application No. 201680090042.6 dated Dec. 2, 2020, 7 pages.

* cited by examiner

--PRIOR ART--

--PRIOR ART--

--PRIOR ART--

--PRIOR ART--

--PRIOR ART--

--PRIOR ART--

CMOS IMAGE SENSOR

CROSS-REFERENCE TO RELATED APPLICATIONS

This application is a national stage of International Application No. PCT/CN2016/102195, filed on Oct. 14, 2016, which is hereby incorporated by reference in its entirety.

TECHNICAL FIELD

The present invention relates to the field of an image sensor, and in particular, to a CMOS image sensor.

BACKGROUND

A CMOS image sensor has a number of pixels on a substrate. FIG. 1 shows only 4 (vertical)×4 (horizontal) pixels. CMOS image sensors are being continuously required to have higher resolutions. It is known that compared with a normal rectangular pixel layout (FIG. 1), a skewed pixel layout (FIG. 2) has a higher resolution in the horizontal and vertical directions. Because pixels in FIG. 2 are skewed by 45 degrees, and assuming that the length of a side of each pixel is p, the distance between the centers of adjacent pixels in the horizontal direction and the distance between the centers of adjacent pixels in the vertical direction in FIG. 1 are both p, while the distances in the horizontal and vertical directions between the centers of adjacent pixels in the oblique direction in FIG. 2 are both p/(square root of 2).

FIG. 3 shows an equivalent circuit diagram of a typical pixel 10 of a CMOS image sensor. A photodiode (PD) converts light into an electrical signal. The electrical signal is selectively transmitted to a charge accumulation portion, for example, a floating diffusion (FD) via a transfer gate (TX). The FD is connected to a gate of a source follower drive transistor (AMP), and an output signal is transmitted to a vertical signal line (Vsig) via a select transistor (SL). Accordingly, if gates of the TX and the SL are turned on, the output signal corresponding to the electrical signal from the PD is obtained on the Vsig. A reset transistor (RS) selectively resets an electrical charge accumulated in the FD.

On the other hand, in the case of a small size pixel, pixel sharing, that means plural pixels share one output circuit, is required. FIG. 4 is a layout example of 8 pixel sharing. 4 (vertical)×2 (horizontal) pixels share one output circuit. This output circuit consists of two FDs, one AMP, one SL, and one RS. Four set of the PDs and the TXs share one FD. Two FDs, a gate of the AMP, and a drain of the RS are connected by metal wiring. The AMP and the SL are serially aligned and a drain of the SL is connected to the Vsig. The wires to the gates of the TXs are not shown in FIG. 4. A photon conversion region consists of the PD and the TX.

In the case of the skewed pixel layout, the layout in FIG. 4 is rotated by 45 degrees (FIG. 5). FIG. 5 shows two sets of 4×2 pixels in FIG. 4. The PD areas, the wires from the drains of the SLs to the Vsigs, and the wires to the gates of the TXs are not shown in FIG. 5.

FIG. 6 shows an example of arrangement of Vsig and TX wires. FIG. 6 shows only a part of pixels in a CMOS image sensor. In FIG. 6, characters A to I indicate vertical positions of FDs, and numbers 1 to 9 indicate horizontal positions of FDs.

Only sixteen horizontal TX wires (first to sixteenth wires from top to bottom) are shown in FIG. 6. The gates of the TXs at the upper side of the FDs at positions C2 (position C in the vertical direction and position 2 in the horizontal direction) and C6 are connected to the second horizontal wire, the gates of the TXs at the left side of the FDs at positions C2 and C6 are connected to the third horizontal wire, the gates of the TXs at the right side of the FDs at positions C2 and C6 are connected to the sixth horizontal wire, the gates of the TXs at the lower side of the FDs at positions C2 and C6 are connected to the eighth horizontal wire, the gates of the TXs at the upper side of the FDs at positions C4 and C8 are connected to the first horizontal wire, the gates of the TXs at the left side of the FDs at positions C4 and C8 are connected to the fourth horizontal wire, the gates of the TXs at the right side of the FDs at positions C4 and C8 are connected to the fifth horizontal wire, and the gates of the TXs at the lower side of the FDs at positions C4 and C8 are connected to the horizontal seventh horizontal wire. Since the vertical positions of the TXs at the upper side of the FDs at positions C2, C4, C6, and C8 are identical, the vertical positions of the first and second wires may be changed. Since the vertical positions of the TXs at the left side and right side of the FDs at positions C2, C4, C6, and C8 are identical, the vertical positions of the third to sixth wires may be changed. Since the vertical positions of the TXs at the lower side of the FDs at positions C2, C4, C6, and C8 are identical, the vertical positions of the seventh and eighth wires may be changed.

Similarly, the gates of the TXs at the upper side of the FDs at positions D1 and D5 are connected to the tenth horizontal wire, the gates of the TXs at the left side of the FDs at positions D1 and D5 are connected to the eleventh horizontal wire, the gates of the TXs at the right side of the FDs at positions D1 and D5 are connected to the fourteenth horizontal wire, the gates of the TXs at the lower side of the FDs at positions D1 and D5 are connected to the sixteenth horizontal wire, the gates of the TXs at the upper side of the FDs at positions D3 and D7 are connected to the ninth horizontal wire, the gates of the TXs at the left side of the FDs at positions D3 and D7 are connected to the twelfth horizontal wire, the gates of the TXs at the right side of the FDs at positions D3 and D7 are connected to the thirteenth horizontal wire, and the gates of the TXs at the lower side of the FDs at positions D3 and D7 are connected to the fifteenth horizontal wire. Since the vertical positions of the TXs at the upper side of the FDs at positions D1, D3, D5, and D7 are identical, the vertical positions of the ninth and tenth wires may be changed. Since the vertical positions of the TXs at the left side and right side of the FDs at positions D1, D3, D5, and D7 are identical, the vertical positions of the eleventh to fourteenth wires may be changed. Since the vertical positions of the TXs at the lower side of the FDs at positions D1, D3, D5, and D7 are identical, the vertical positions of the fifteenth and sixteenth wires may be changed.

Eight vertical Vsigs (Vsig_n, first to eighth Vsigs from left to right) are shown in FIG. 6. The wire connecting two FDs at positions D1 and E2 is connected to the first Vsig via the AMP and the SL, the wire connecting two FDs at positions H1 and I2 is connected to the first Vsig via the AMP and the SL, the wire connecting two FDs at positions C2 and D3 is connected to the second Vsig via the AMP and the SL, the wire connecting two FDs at positions G2 and H3 is connected to the second Vsig via the AMP and the SL, the wire connecting two FDs at positions B3 and C4 is connected to the third Vsig via the AMP and the SL, the wire connecting two FDs at positions F3 and G4 is connected to the third Vsig via the AMP and the SL, the wire connecting two FDs at positions A4 and B5 is connected to the fourth Vsig via the AMP and the SL, the wire connecting two FDs at positions E4 and F5 is connected to the fourth Vsig via the AMP and the SL, the wire connecting two FDs at positions D5 and E6 is connected to the fifth Vsig via the AMP and the SL, the wire connecting two FDs at positions H5 and I6 is connected to the fifth Vsig via the AMP and the SL, the wire connecting two FDs at positions C6 and D7 is connected to the sixth Vsig via the AMP and the SL, the wire connecting two FDs at positions G6 and H7 is connected to the sixth Vsig via the AMP and the SL, the wire connecting two FDs at positions B7 and C8 is connected to the seventh Vsig via the AMP and the SL, the wire connecting two FDs at positions F7 and G8 is connected to the seventh Vsig via the AMP and the SL, the wire connecting two FDs at positions A8 and B9 is connected to the eighth Vsig via the AMP and the SL, and the wire connecting two FDs at positions E8 and F9 is connected to the eighth Vsig via the AMP and the SL.

The Vsigs are vertically aligned by pitch of 1.4 p (square root of 2 multiplied by p), where p is length of a side of a rectangular pixel. 8 TX lines pass horizontally within 1.4 p. It means the distance between lines becomes 0.17 p (1.4 p divided by 8). If p=1 μm (micrometer), then 0.17 p=0.17 μm. This is too narrow to fabricate with 1 metal layer, and moreover there is no space to place additional lines. By conventional pixel sharing layout, it is difficult to layout TX lines in a honeycomb and 8 pixel shared scheme.

SUMMARY

A CMOS image sensor is provided to achieve efficient wiring for the skewed pixels.

According to a first aspect, a complementary metal oxide semiconductor (CMOS) image sensor is provided, where the CMOS image sensor includes:
a first plurality of pixel units where pixel units are arranged in lattice manner, and the pixel unit is obtained by rotating a rectangular area including four sets of photodiodes and transfer gates (TXs) and one charge accumulation portion by 45 degrees, and
a second plurality of pixel units where pixel units are arranged at the positions which are shifted in the horizontal direction by half of the distance between the centers of the adjacent pixel units in the horizontal direction and shifted in the vertical direction by half of the distance between the centers of the adjacent pixel units in the vertical direction from the positions of the respective pixel units included in the first plurality of pixel units,
where gates of the TXs at corresponding positions of a first pixel unit, a second pixel unit adjacent to the first pixel unit in the oblique direction, and a third pixel unit adjacent to the first pixel unit in the horizontal direction and adjacent to the second pixel unit in the oblique direction are connected in sequence with wires in the oblique directions.

In a first possible implementation manner of the first aspect, the pixel units are paired in the vertical direction, and the charge accumulation portions of each pair are connected to one output circuit that converts the voltage of the charge accumulation portion to a vertical signal line (Vsig).

With reference to the first aspect or the first possible implementation manner of the first aspect, in a second possible implementation manner of the first aspect, the wires in the oblique directions are repeated in a zigzag manner.

With reference to the first aspect or the first possible implementation manner of the first aspect, in a third possible implementation manner of the first aspect, gates of the TXs at corresponding positions of the third pixel unit and a fourth pixel unit adjacent to the third pixel unit in the horizontal direction at the other side of the first pixel unit are connected with a wire in the horizontal direction.

With reference to the third possible implementation manner of the first aspect, in a fourth possible implementation manner of the first aspect, the pixel unit adjacent to the second pixel unit in the horizontal direction is controlled independently from the first to fourth pixel units.

With reference to the third possible implementation manner of the first aspect, in a fifth possible implementation manner, the wires in the oblique directions are repeated in a zigzag manner except for the case where the TXs of the pixel units are connected with the wire in the horizontal direction.

With reference to the first aspect or the first possible implementation manner of the first aspect, in a sixth possible implementation manner of the first aspect, one vertical signal line (Vsig) is provided for each column of the pixel units in the vertical direction.

With reference to the first possible implementation manner of the first aspect, in a seventh possible implementation manner of the first aspect, a plurality of Vsigs are provided for each column of the pixel units in the vertical direction, and the output circuit is connected to any one of the plurality of Vsigs.

With reference to the first aspect or the first possible implementation manner of the first aspect, in an eighth possible implementation manner of the first aspect, more than one TXs included in each pair of the pixel units in the vertical direction are simultaneously turned on.

With reference to the first possible implementation manner of the first aspect, in a ninth possible implementation manner of the first aspect, the output circuit includes a reset transistor and a source follower drive transistor (AMP), and the AMP is connected to a Vsig via a selector transistor (SL).

With reference to the first aspect or the first possible implementation manner of the first aspect, in an tenth possible implementation manner of the first aspect, the charge accumulation portion includes a floating diffusion (FD).

The CMOS image sensor is provided according to the various implementation manners to realize efficient wiring for the skewed pixels.

BRIEF DESCRIPTION OF DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. The described embodiments are merely some but not all of the embodiments of the present invention. All other embodiments obtained by a person of ordinary skill in the art based on the embodiments of the present invention without creative efforts shall fall within the protection scope of the present invention.

Figure 1:
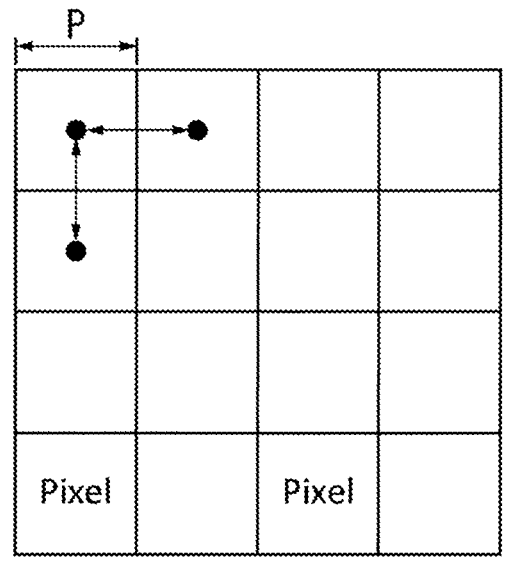
FIG. 1 illustrates a normal rectangular pixel layout.
Figure 2:
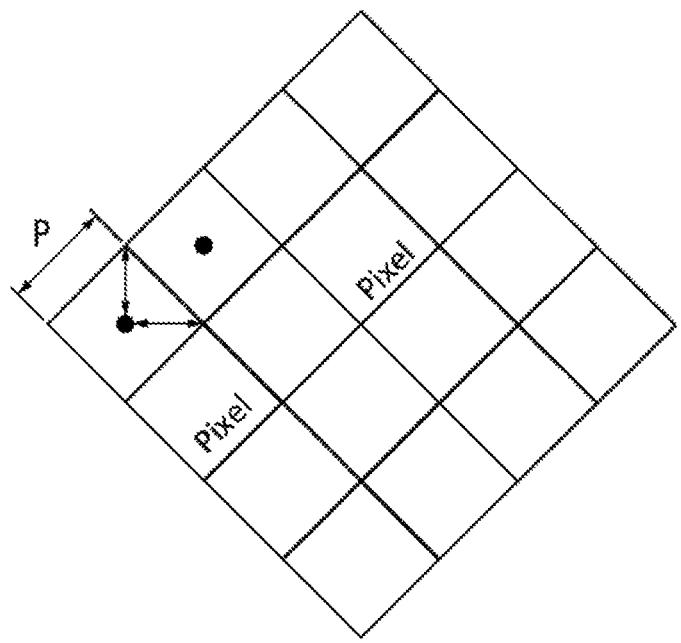
FIG. 2 illustrates a skewed pixel layout.
Figure 3:
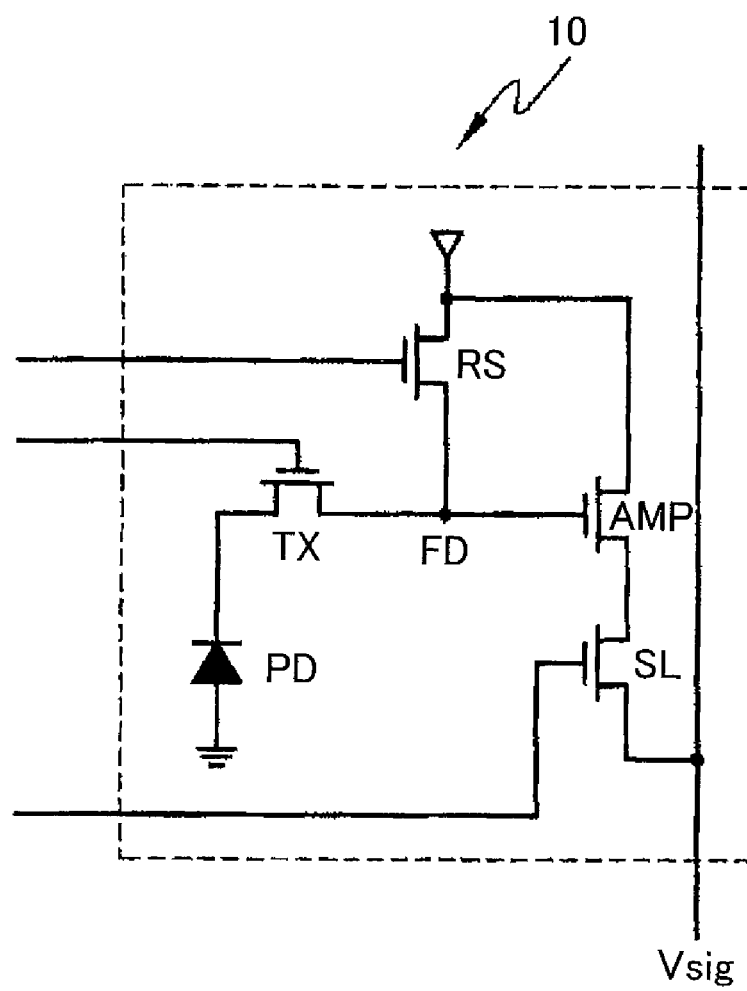
FIG. 3 illustrates an equivalent circuit diagram of a typical pixel 10 of a CMOS image sensor.
Figure 4:
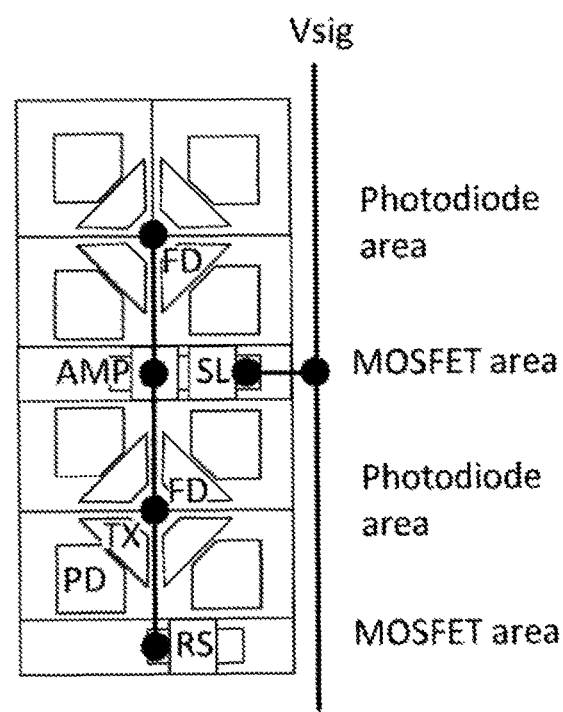
FIG. 4 illustrates a layout example of 8 pixel sharing.
Figure 7:
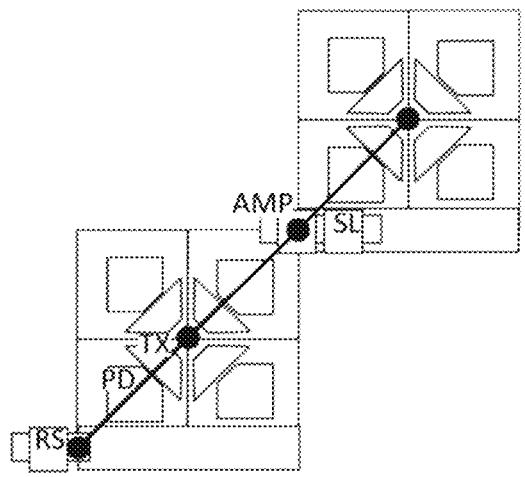
FIG. 7 illustrates an 8 shared pixel layout.
Figure 8:
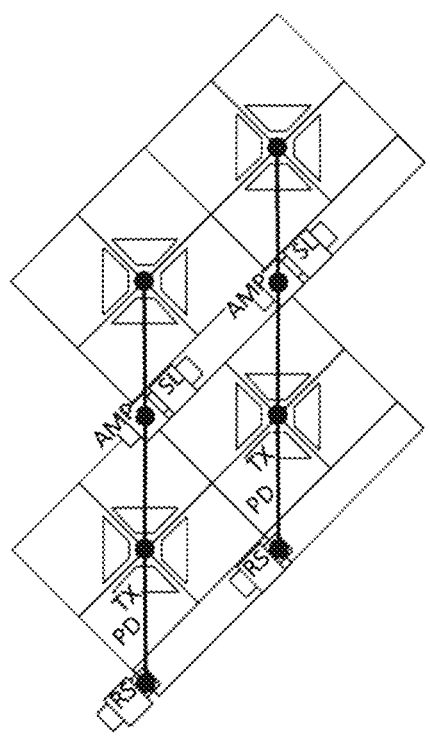
FIG. 8 illustrates a honeycomb pixel layout.

One pixel unit has 2 (vertical)×2 (horizontal) PDs sharing one FD, and this makes a 4 shared pixel unit. Two 4 shared pixel units verge corner to corner and two FDs are connected with a metal wire. This makes an 8 shared pixel unit. When 8 shared pixel units are rotated by 45 degrees and make a honeycomb pixel layout, the number of TX lines can be reduced compared with a conventional layout. FIG. 7 shows a new layout of 8 shared pixels compared with a conventional one (FIG. 4). Two 4 shared pixel units of 2×2 pixels are aligned in skew and two FDs are connected by a metal wire. These 8 pixels make an 8 shared pixel unit. Then 8 shared pixel units are rotated by 45 degrees and make a honeycomb pixel layout (FIG. 8 (the PD areas are not shown)).

Figure 6:
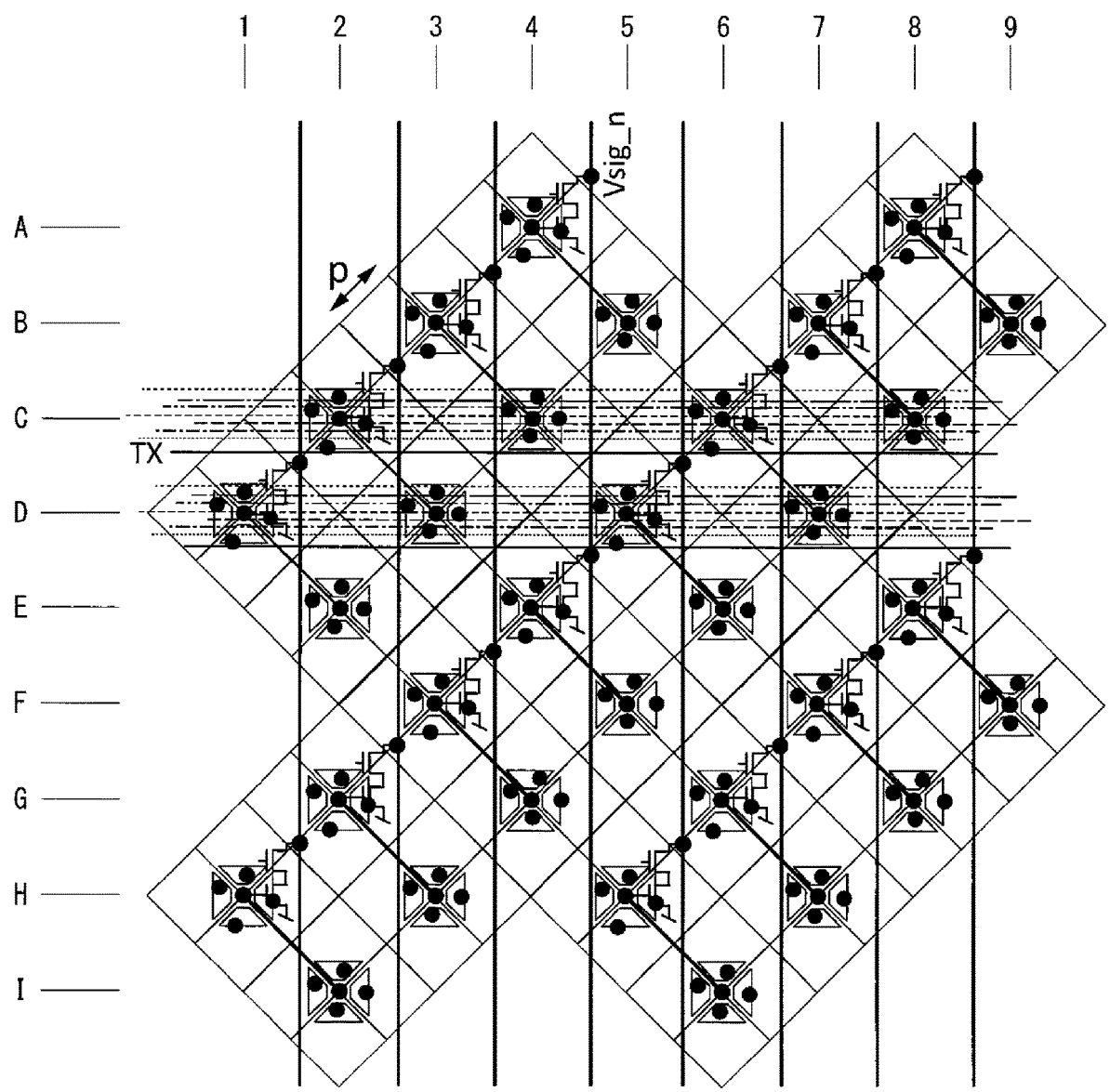
FIG. 6 illustrates an example of arrangement of Vsig and TX lines.
Figure 9:
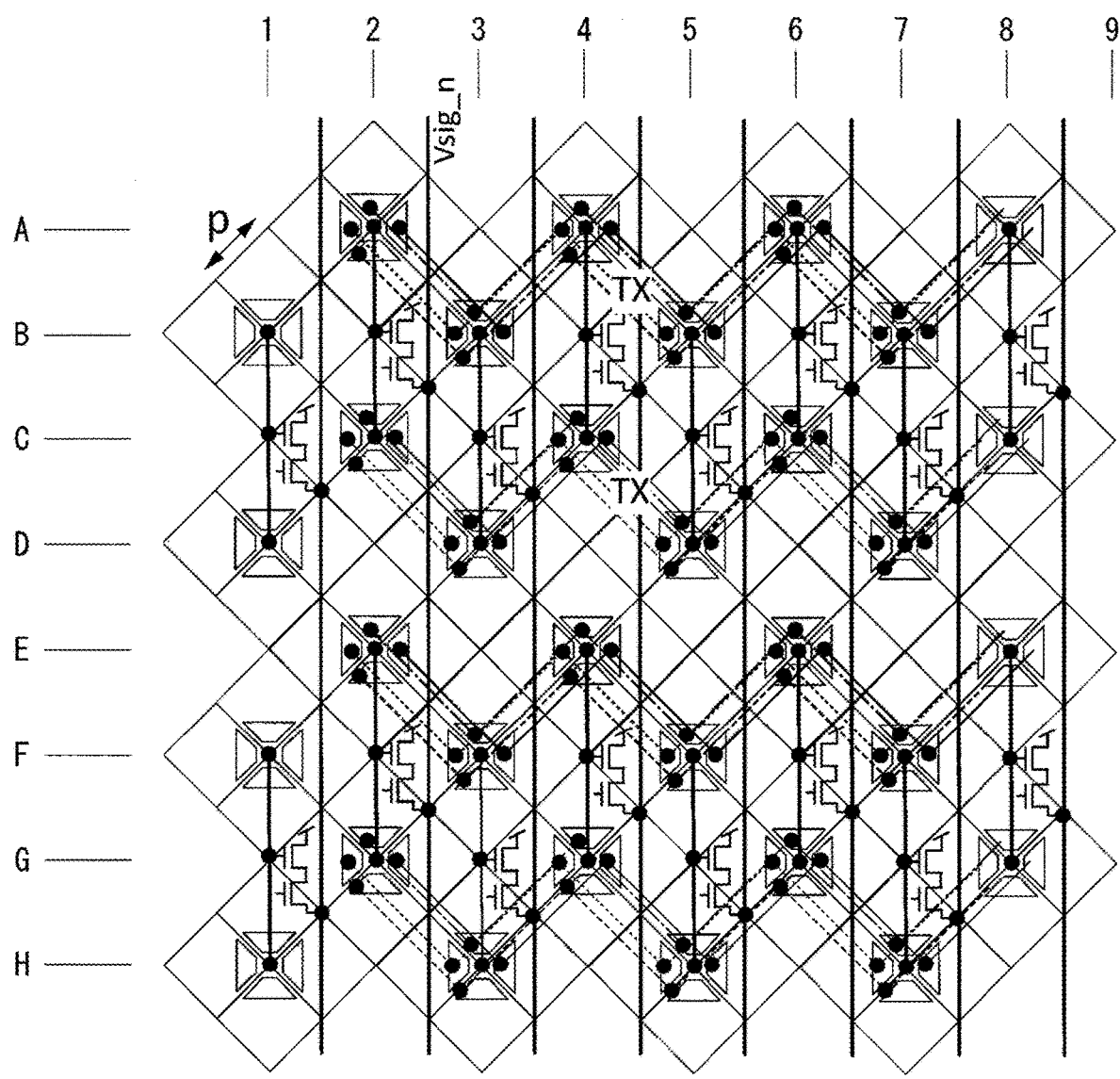
FIG. 9 illustrates a honeycomb pixel layout with Vsig and TX lines.

FIG. 9 shows a honeycomb pixel layout with Vsig and TX lines. Same as FIG. 6, Vsig lines are vertically aligned by pitch of 1.4 p. 4 TX lines run toward the horizontal direction in a zigzag manner.

FIG. 9 shows only a part of the pixels in a CMOS image sensor. In FIG. 9, characters A to H indicate vertical positions of FDs, and numbers 1 to 8 indicate horizontal positions of FDs. A pixel unit is obtained by rotating a rectangular area including four sets of PDs and TXs and one FD by 45 degrees. Although the pixel unit shown in FIG. 9 is a square, the shape of the pixel unit may be an approximate square or a rectangle. The CMOS image sensor includes a first plurality of pixel units in which pixel units are arranged in lattice manner, and a second plurality of pixel units in which pixel units are arranged at the positions which are shifted in the horizontal direction by half of the distance between the centers of the adjacent pixel units in the horizontal direction and shifted in the vertical direction by half of the distance between the centers of the adjacent pixel units in the vertical direction from the positions of the respective pixel units included in the first plurality of pixel units. The lattice is not limited to a square lattice, namely, the horizontal spacing in the lattice is not necessarily identical to the vertical spacing.

In FIG. 9, the gates of the TXs at the upper side of the FDs at positions A2 (position A in the vertical direction and position 2 in the horizontal direction), B3, A4, B5, A6, and B7 are connected to the first wire, the gates of the TXs at the left side of the FDs at positions A2, B3, A4, B5, A6, and B7 are connected to the second wire, the gates of the TXs at the right side of the FDs at positions A2, B3, A4, B5, A6, and B7 are connected to the third wire, and the gates of the TXs at the lower side of the FDs at positions A2, B3, A4, B5, A6, and B7 are connected to the fourth wire. Although the wires are shown only between the TXs around the FDs at positions 2 to 7 in the horizontal direction, the wires are repeated in the same way in a zigzag manner. Similarly, the gates of the TXs at the upper side of the FDs at positions C2, D3, C4, D5, C6, and D7 are connected to the fifth wire, the gates of the TXs at the left side of the FDs at positions C2, D3, C4, D5, C6, and D7 are connected to the sixth wire, the gates of the TXs at the right side of the FDs at positions C2, D3, C4, D5, C6, and D7 are connected to the seventh wire, and the gates of the TXs at the lower side of the FDs at positions C2, D3, C4, D5, C6, and D7 are connected to the eighth wire. Similarly, the gates of the TXs at the upper side of the FDs at positions E2, F3, E4, F5, E6, and F7 are connected to the ninth wire, the gates of the TXs at the left side of the FDs at positions E2, F3, E4, F5, E6, and F7 are connected to the tenth wire, the gates of the TXs at the right side of the FDs at positions E2, F3, E4, F5, E6, and F7 are connected to the eleventh wire, and the gates of the TXs at the lower side of the FDs at positions E2, F3, E4, F5, E6, and F7 are connected to the twelfth wire. Similarly, the gates of the TXs at the upper side of the FDs at positions G2, H3, G4, H5, G6, and H7 are connected to the thirteenth wire, the gates of the TXs at the left side of the FDs at positions G2, H3, G4, H5, G6, and H7 are connected to the fourteenth wire, the gates of the TXs at the right side of the FDs at positions G2, H3, G4, H5, G6, and H7 are connected to the fifteenth wire, and the gates of the TXs at the lower side of the FDs at positions G2, H3, G4, H5, G6, and H7 are connected to the sixteenth wire. The same applies to the other pixel units not shown in FIG. 9. In general, gates of the TXs at corresponding positions of a first pixel unit (for example, the pixel unit having the FD at position A2), a second pixel unit (for example, the pixel unit having the FD at position B3) adjacent to the first pixel unit in the oblique direction, and a third pixel unit (for example, the pixel unit having the FD at position A4) adjacent to the first pixel unit in the horizontal direction and adjacent to the second pixel unit in the oblique direction are connected in sequence with wires in the oblique directions, and the wires in the oblique directions are repeated in a zigzag manner.

Eight vertical Vsigs (Vsig_n, first to eight Vsigs from left to right) are shown in FIG. 9. The wire connecting two FDs at positions B1 and D1 is connected to the first Vsig via the AMP and the SL, the wire connecting two FDs at positions F1 and H1 is connected to the first Vsig via the AMP and the SL, the wire connecting two FDs at positions A2 and C2 is connected to the second Vsig via the AMP and the SL, the wire connecting two FDs at positions E2 and G2 is connected to the second Vsig via the AMP and the SL, the wire connecting two FDs at positions B3 and D3 is connected to the third Vsig via the AMP and the SL, the wire connecting two FDs at positions F3 and H3 is connected to the third Vsig via the AMP and the SL, the wire connecting two FDs at positions A4 and C4 is connected to the fourth Vsig via the AMP and the SL, the wire connecting two FDs at positions E4 and G4 is connected to the fourth Vsig via the AMP and the SL, the wire connecting two FDs at positions B5 and D5 is connected to the fifth Vsig via the AMP and the SL, the wire connecting two FDs at positions F5 and H5 is connected to the fifth Vsig via the AMP and the SL, the wire connecting two FDs at positions A6 and C6 is connected to the sixth Vsig via the AMP and the SL, the wire connecting two FDs at positions E6 and G6 is connected to the sixth Vsig via the AMP and the SL, the wire connecting two FDs at positions B7 and D7 is connected to the seventh Vsig via the AMP and the SL, the wire connecting two FDs at positions F7 and H7 is connected to the seventh Vsig via the AMP and the SL, the wire connecting two FDs at positions A8 and C8 is connected to the eighth Vsig via the AMP and the SL, and the wire connecting two FDs at positions E8 and G8 is connected to the eighth Vsig via the AMP and the SL. The above-mentioned wires connecting two FDs are also connected to the respective RSs. Accordingly, the pixel units are paired in the vertical direction, and the charge accumulation portions, for example, FDs of each pair are connected to one output circuit that converts the voltage of the charge accumulation portion to a Vsig, and one Vsig is provided for each column of the pixel units in the vertical direction. In one embodiment, the output circuit includes a RS and an AMP, and the AMP is connected to a Vsig via an SL.

In the honeycomb pixel layout with Vsig and TX lines shown in FIG. 9, 4 TX lines are between 2 p. If p=1 µm, line by line distance is 0.5 µm. This is triple that of a conventional layout and this means it is easy to fabricate and has more space for additional line.

Figure 10:
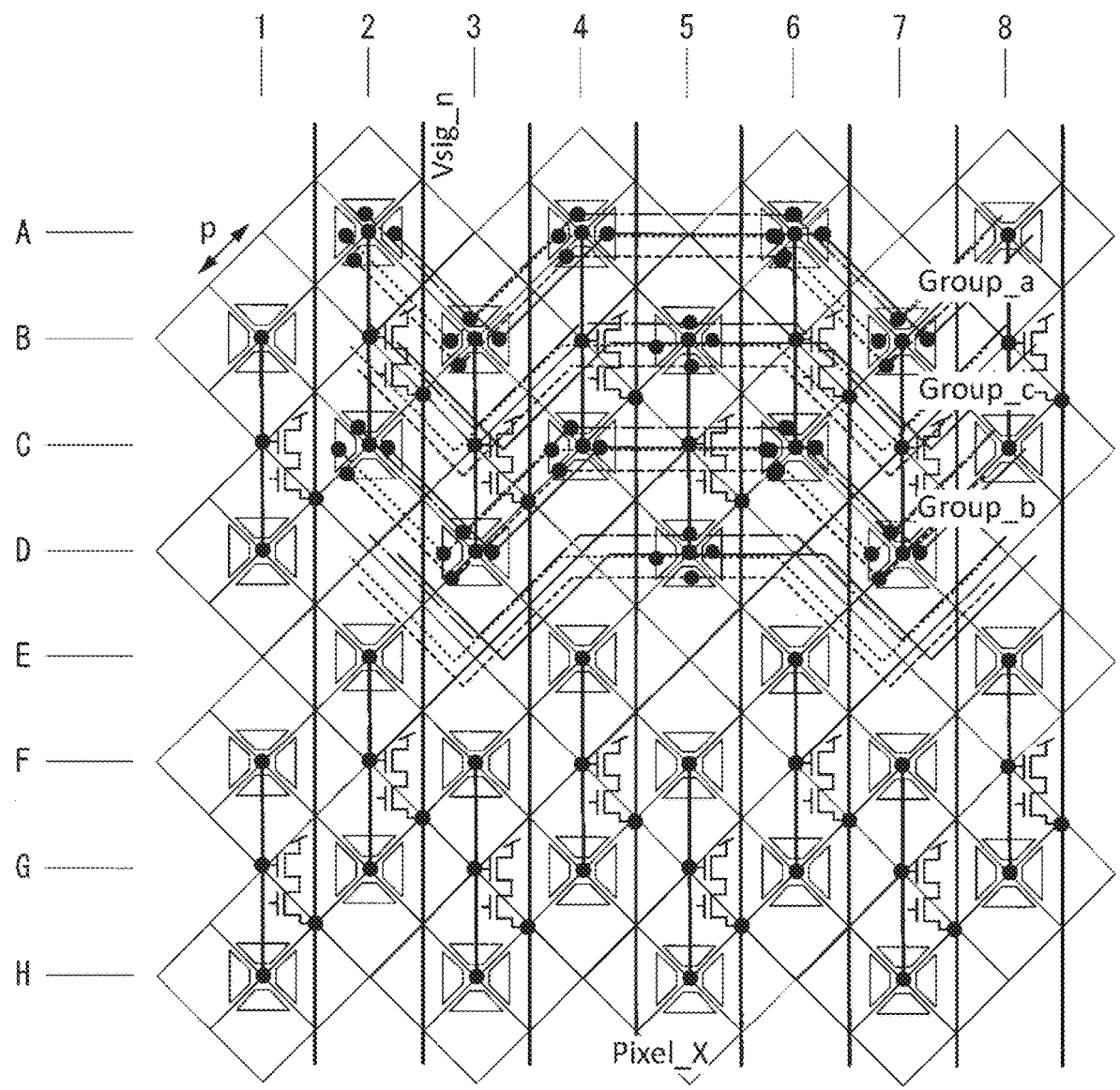
FIG. 10 illustrates another honeycomb pixel layout with Vsig and TX wires.

FIG. 10 shows another honeycomb pixel layout with Vsig and TX wires. Four pixel units having FDs at position B5, D5, F5, and H5 (Pixel_Xs in FIG. 10) are controlled separately from the rest of the pixel units. Tx lines connected to the pixel units having FDs at position A2, B3, A4, A6, and B7 belong to Group_a, Tx lines connected to the pixel units having FDs at position C2, D3, C4, C6, and D7 belong to Group_b, and TX lines of Group_c are added between Group_a and Group_b to control the pixel unit having FD at position B5. Similarly, Tx lines are added to control the pixel units having FDs at position D5, F5, and H5 (the TX lines for the pixel units having FDs at position F5 and H5 are not shown in FIG. 10). This example is useful for independently controlling special pixels which are separately located.

FIG. 10 shows only a part of pixels in a CMOS image sensor. Characters A to H in FIG. 10 indicate vertical positions of FDs, and numbers 1 to 8 in FIG. 10 indicate horizontal positions of FDs. In FIG. 10, the gates of the TXs at the upper side of the FDs at positions A2, B3, A4, A6, and B7 are connected to the first wire, the gates of the TXs at the left side of the FDs at positions A2, B3, A4, A6, and B7 are connected to the second wire, the gates of the TXs at the right side of the FDs at positions A2, B3, A4, A6, and B7 are connected to the third wire, and the gates of the TXs at the lower side of the FDs at positions A2, B3, A4, A6, and B7 are connected to the fourth wire. Although the wires are shown only between the TXs around the FDs at positions 2 to 7 in the horizontal direction, the wires are repeated in a zigzag manner except for the case where the TXs are connected with the wire in the horizontal direction. The first to fourth wires constitute Group_a. Similarly, the gates of the TXs at the upper side of the FDs at positions C2, D3, C4, C6, and D7 are connected to the ninth wire, the gates of the TXs at the left side of the FDs at positions C2, D3, C4, C6, and D7 are connected to the tenth wire, the gates of the TXs at the right side of the FDs at positions C2, D3, C4, C6, and D7 are connected to the eleventh wire, and the gates of the TXs at the lower side of the FDs at positions C2, D3, C4, C6, and D7 are connected to the twelfth wire. The ninth to twelfth wires constitute Group_b.

In FIG. 10, the gate of the TX at the upper side of the FD at positions B5 is connected to the fifth wire, the gate of the TX at the left side of the FD at positions B5 is connected to the sixth wire, the gate of the TX at the right side of the FD at positions B5 is connected to the seventh wire, and the gate of the TX at the lower side of the FD at positions B5 is connected to the eighth wire. The fifth to eighth wires constitute Group_c. The wires of Group_c extend in parallel with the wires of Group_a. Similarly, the gate of the TX at the upper side of the FD at positions D5 is connected to the thirteenth wire, the gate of the TX at the left side of the FD at positions D5 is connected to the fourteenth wire, the gate of the TX at the right side of the FD at positions D5 is connected to the fifteenth wire, and the gate of the TX at the lower side of the FD at positions D5 is connected to the sixteenth wire. In general, gates of the TXs at corresponding positions of the third pixel unit (in the foregoing example, the pixel unit having the FD at position A4) and a fourth pixel unit (for example, the pixel unit having the FD at position A6) adjacent to the third pixel unit in the horizontal direction at the other side of the first pixel unit (in the foregoing example, the pixel unit having the FD at position A2) are connected with a wire in the horizontal direction, the pixel unit adjacent to the second pixel unit in the horizontal direction is controlled independently from the first to fourth pixel units, and the wires in the oblique directions are repeated in a zigzag manner except for the case where the TXs of the pixel units are connected with the wire in the horizontal direction. Namely, one or more pixel units may be connected to the wires of Group_c. The remaining pixel units in FIG. 10 may be wired in the same way as the pixel units connected to the first to sixteenth wires mentioned above, or may be wired in a zigzag manner as shown in FIG. 9. The same applies to the other pixel units not shown in FIG. 10.

In FIG. 10, the wiring to the Vsigs are identical to that in FIG. 9. However, the number of Vsig lines may be doubled. In one embodiment, sixteen Vsigs (first to sixteenth Vsigs from left to right) are provided, the wire connecting two FDs at positions B1 and D1 is connected to the second Vsig via the AMP and the SL, the wire connecting two FDs at positions F1 and H1 is connected to the first Vsig via the AMP and the SL, the wire connecting two FDs at positions A2 and C2 is connected to the fourth Vsig via the AMP and the SL, the wire connecting two FDs at positions E2 and G2 is connected to the third Vsig via the AMP and the SL, the wire connecting two FDs at positions B3 and D3 is connected to the sixth Vsig via the AMP and the SL, the wire connecting two FDs at positions F3 and H3 is connected to the fifth Vsig via the AMP and the SL, the wire connecting two FDs at positions A4 and C4 is connected to the eighth Vsig via the AMP and the SL, the wire connecting two FDs at positions E4 and G4 is connected to the seventh Vsig via the AMP and the SL, the wire connecting two FDs at positions B5 and D5 is connected to the tenth Vsig via the AMP and the SL, the wire connecting two FDs at positions F5 and H5 is connected to the ninth Vsig via the AMP and the SL, the wire connecting two FDs at positions A6 and C6 is connected to the twelfth Vsig via the AMP and the SL, the wire connecting two FDs at positions E6 and G6 is connected to the eleventh Vsig via the AMP and the SL, the wire connecting two FDs at positions B7 and D7 is connected to the fourteenth Vsig via the AMP and the SL, the wire connecting two FDs at positions F7 and H7 is connected to the thirteenth Vsig via the AMP and the SL, the wire connecting two FDs at positions A8 and C8 is connected to the sixteenth Vsig via the AMP and the SL, and the wire connecting two FDs at positions E8 and G8 is connected to the fifteenth Vsig via the AMP and the SL. In other words, two Vsigs are provided for each column of the pixel units in the vertical direction, and the SL in the output circuit is connected to one of the two Vsigs, for example, alternately. Furthermore, a plurality of Vsigs may be provided for each column of the pixel units in the vertical direction, and the SL in the output circuit may be connected to any one of the plurality of Vsigs, for example, in a predetermined order.

More than one electrical signals from more than one PDs which share the FDs may be simultaneously transmitted to one Vsig, in other words, more than one TXs included in each pair of the pixel units in the vertical direction may be simultaneously turned on. Specifically, in FIG. 11A, pixels 1_1 to 1_8 share FDs at positions A2 and C2, and pixels 2_1 to 2_8 share FDs at positions E2 and G2. The wiring to the Vsigs (Vsig_n) are identical to the wiring to the first to fourth Vsigs in FIG. 9. Accordingly, pixels 1_1 to 1_8 and 2_1 to 2_8 shares the second Vsig. If more than one electrical signals from pixels 1_1 to 1_8 are simultaneously transmitted to the second Vsig, the charge from the pixels are added up at FDs, and the corresponding output signal is transmitted to the Vsig. If the output signals from the drain of the SL connected to the AMP between the FDs at positions A2 and C2 and the drain of the SL connected to the AMP between the FDs at positions E2 and G2 are simultaneously transmitted to the second Vsig, the output signals are averaged at the second Vsig.

Figure 5:
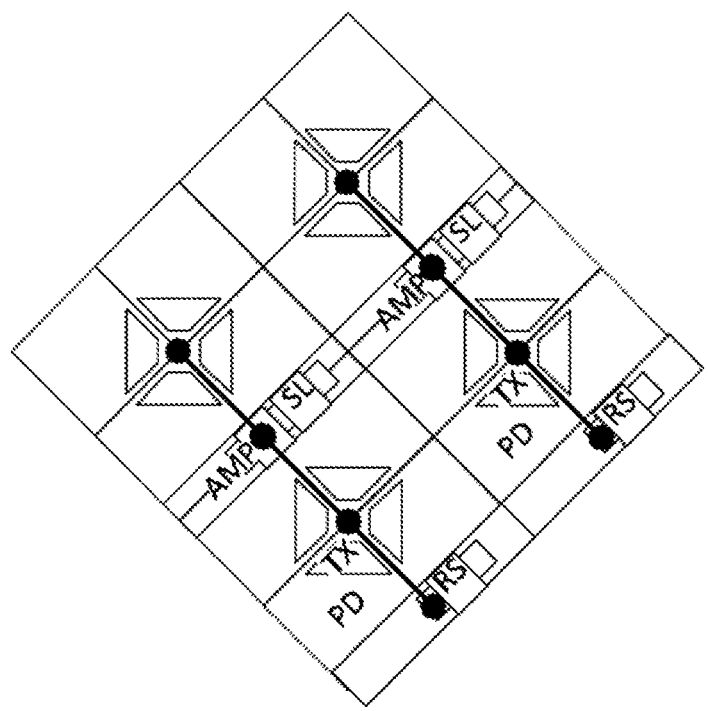
FIG. 5 illustrates two sets of 4×2 pixels in FIG. 4.
Figure 11A:
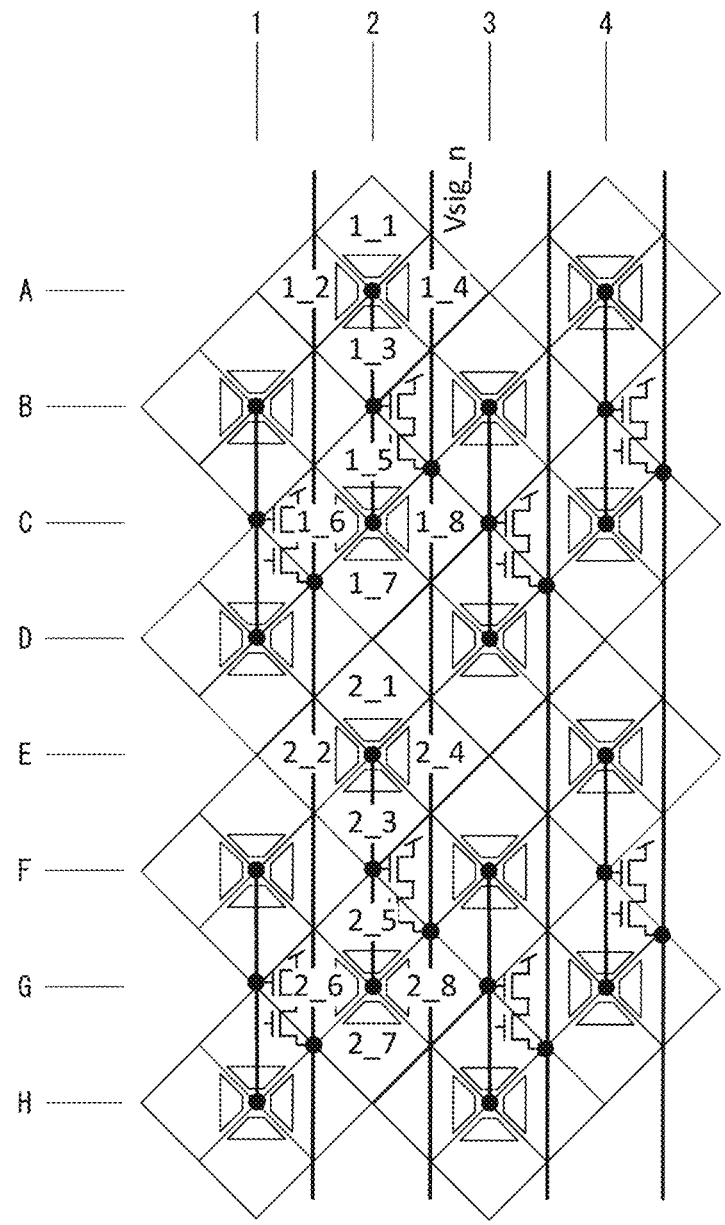
FIG. 11A illustrates a honeycomb pixel layout with Vsig lines.
Figure 11B:
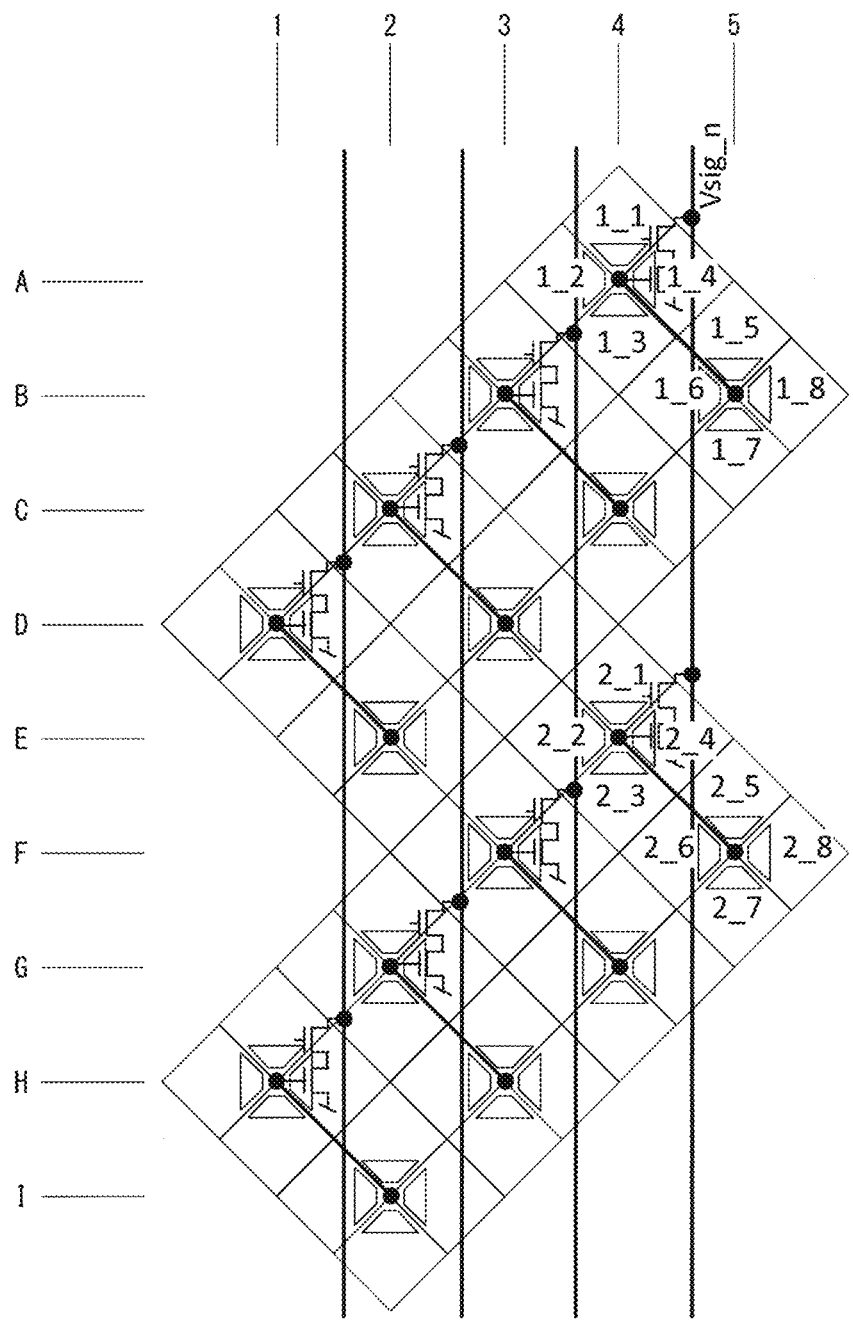
FIG. 11B illustrates a skewed pixel layout with Vsig lines.

In FIG. 11A, pixels that can be output by charge adding or signal averaging via one Vsig_n line are arranged in the vertical direction. On the other hand, in FIG. 11B having a skewed layout shown FIG. 5, pixels that can be output by charge adding or signal averaging via one Vsig_n line are not arranged in the vertical direction. For example, the electrical signals from pixels 1_1 to 1_8 and 2_1 to 2_8 in FIG. 11B may be simultaneously transmitted to the fourth Vsig, however, since the pixel units having the FDs at positions A4 and B5 are not verticality arranged, and the pixel units having the FDs at positions E4 and F5 are not verticality arranged, the output signal obtained on the fourth Vsig is not addition or average of the electrical signals in the vertical direction. Accordingly, comparing these two layouts, the layout in FIG. 11A is better than the layout in FIG. 11B for signal processing.

What is disclosed above is merely exemplary embodiments of the present invention, and certainly is not intended to limit the protection scope of the present invention. A person of ordinary skill in the art may understand that all or some of processes that implement the foregoing embodiments and equivalent modifications made in accordance with the claims of the present invention shall fall within the scope of the present invention.

What is claimed is:

1. A complementary metal oxide semiconductor (CMOS) image sensor, comprising:
    a first plurality of pixel units, wherein the first plurality of pixel units are arranged in lattice manner, and wherein each of the first plurality of pixel units is obtained by rotating a rectangular area including four sets of photodiodes and transfer gates (TXs) and one charge accumulation portion by 45 degrees; and
    a second plurality of pixel units, wherein the second plurality of pixel units are arranged at positions which are shifted in a horizontal direction by half of distance between the centers of adjacent pixel units in the horizontal direction and shifted in a vertical direction by half of distance between the centers of adjacent pixel units in the vertical direction from positions of respective pixel units included in the first plurality of pixel units,
    wherein gates of the TXs at corresponding positions of a first pixel unit, a second pixel unit adjacent to the first pixel unit in an oblique direction, and a third pixel unit adjacent to the first pixel unit in the horizontal direction and adjacent to the second pixel unit in another oblique direction are connected in sequence with wires in the oblique directions, and
    wherein gates of the TXs at corresponding positions of the third pixel unit and a fourth pixel unit adjacent to the third pixel unit in the horizontal direction at the other side of the first pixel unit are connected with a wire in the horizontal direction.

2. The CMOS image sensor according to claim 1, wherein the pixel units are paired in the vertical direction, and wherein the charge accumulation portions of each pair are connected to one output circuit that converts the voltage of the charge accumulation portion to a vertical signal line (Vsig).

3. The CMOS image sensor according to claim 1, wherein the wires in the oblique directions are repeated in a zigzag manner.

4. The CMOS image sensor according to claim 1, wherein the pixel unit adjacent to the second pixel unit in the horizontal direction is controlled independently from the first to fourth pixel units.

5. The CMOS image sensor according to claim 1, wherein the wires in the oblique directions are repeated in a zigzag manner except for the case where the TXs of the pixel units are connected with the wire in the horizontal direction.

6. The CMOS image sensor according to claim 1, wherein one vertical signal line (Vsig) is provided for each column of the pixel units in the vertical direction.

7. The CMOS image sensor according to claim 2, wherein a plurality of Vsigs are provided for each column of the pixel units in the vertical direction, and wherein the output circuit is connected to any one of the plurality of Vsigs.

8. The CMOS image sensor according to claim 1, wherein more than one TXs included in each pair of the pixel units in the vertical direction are simultaneously turned on.

9. The CMOS image sensor according to claim 2, wherein the output circuit includes a reset transistor and a source follower drive transistor (AMP), and wherein the AMP is connected to a Vsig via a selector transistor (SL).

10. The CMOS image sensor according to claim 1, wherein the charge accumulation portion includes a floating diffusion (FD).

* * * * *

UNITED STATES PATENT AND TRADEMARK OFFICE
CERTIFICATE OF CORRECTION

PATENT NO. : 10,910,429 B2
APPLICATION NO. : 16/341482
DATED : February 2, 2021
INVENTOR(S) : Makoto Monoi It is certified that error appears in the above-identified patent and that said Letters Patent is hereby corrected as shown below:

On the Title Page

In Column 2 item (57), (Abstract), Line 1, after "of" insert --a--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*